United States Patent
Thalmann et al.

(10) Patent No.: US 9,435,849 B2
(45) Date of Patent: Sep. 6, 2016

(54) METHOD FOR TESTING SEMICONDUCTOR DIES AND A TEST APPARATUS

(71) Applicant: Infineon Technologies AG, Neubiberg (DE)

(72) Inventors: Erwin Thalmann, Gundersheim (AT); Michael Leutschacher, Finkenstein (AT); Christian Musshoff, Villach (AT); Stefan Kramp, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/319,268

(22) Filed: Jun. 30, 2014

(65) Prior Publication Data

US 2015/0377954 A1    Dec. 31, 2015

(51) Int. Cl.
  *G01R 31/26* (2014.01)
  *G01R 1/073* (2006.01)
(52) U.S. Cl.
  CPC ....... *G01R 31/2608* (2013.01); *G01R 1/07342* (2013.01); *G01R 31/2601* (2013.01)
(58) Field of Classification Search
  CPC .......... H01L 2924/00; G01R 31/2889; G01R 1/0408; G01R 1/07378; G01R 31/2891; G01R 31/31926; G01R 1/06772; G01R 1/073; G01R 1/0433; G01R 1/067; G01R 1/06744; G01R 1/0675; G01R 31/2831; G01R 31/2851
  USPC ............ 324/756.03, 754.03, 755.01, 762.01, 324/762.02, 750.24, 762.05, 750.01, 324/750.02, 754.07, 754.11; 257/48, 257/E21.002
  See application file for complete search history.

(56) References Cited

U.S. PATENT DOCUMENTS

| | | | | |
|---|---|---|---|---|
| 2009/0224784 A1* | 9/2009 | Pagani | ............... | G01R 31/3172 324/762.02 |
| 2011/0089967 A1* | 4/2011 | Kim | ...................... | B81C 99/005 324/756.03 |
| 2011/0227600 A1* | 9/2011 | Baeg | ................ | G01R 31/31721 324/762.01 |
| 2011/0291679 A1* | 12/2011 | Pagani | ............... | G01R 31/3172 324/750.01 |

* cited by examiner

*Primary Examiner* — David Vu
*Assistant Examiner* — Jonathan Han
(74) *Attorney, Agent, or Firm* — Murphy, Bilak & Homiller, PLLC

(57) ABSTRACT

A method includes: providing a test apparatus; providing an electrically conductive carrier; providing a semiconductor substrate having a first main face, a second main face opposite to the first main face, and a plurality of semiconductor dies, the semiconductor dies including a first contact element on the first main face and a second contact element on the second main face; placing the semiconductor substrate on the carrier with the second main face facing the carrier; electrically connecting the carrier to a contact location disposed on the first main face; and testing a semiconductor die by electrically connecting the test apparatus with the first contact element of the semiconductor die and the contact location.

4 Claims, 3 Drawing Sheets

METHOD FOR TESTING SEMICONDUCTOR DIES AND A TEST APPARATUS

TECHNICAL FIELD

The present disclosure relates to a method for testing semiconductor dies, to a test apparatus, and to a test pin assembly for a test apparatus.

BACKGROUND

In power electronics very often semiconductor chips with vertical transistors like, for example, IGBT transistors are used or, in general, transistors in which at least one electrical contact element is arranged on a first main face of the semiconductor chip and at least one other electrical contact element is arranged on a second main face of the semiconductor chip opposite to the first main face. Before delivering the semiconductor chips to a customer, it is important to know whether the semiconductor chips are in good order or whether they fulfill predetermined performance criteria. A further advantage would be a testing of the semiconductor chips immediately after the frontend processing on a wafer level basis as cost savings are high if defect devices could be identified in an early stage of the fabrication process.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
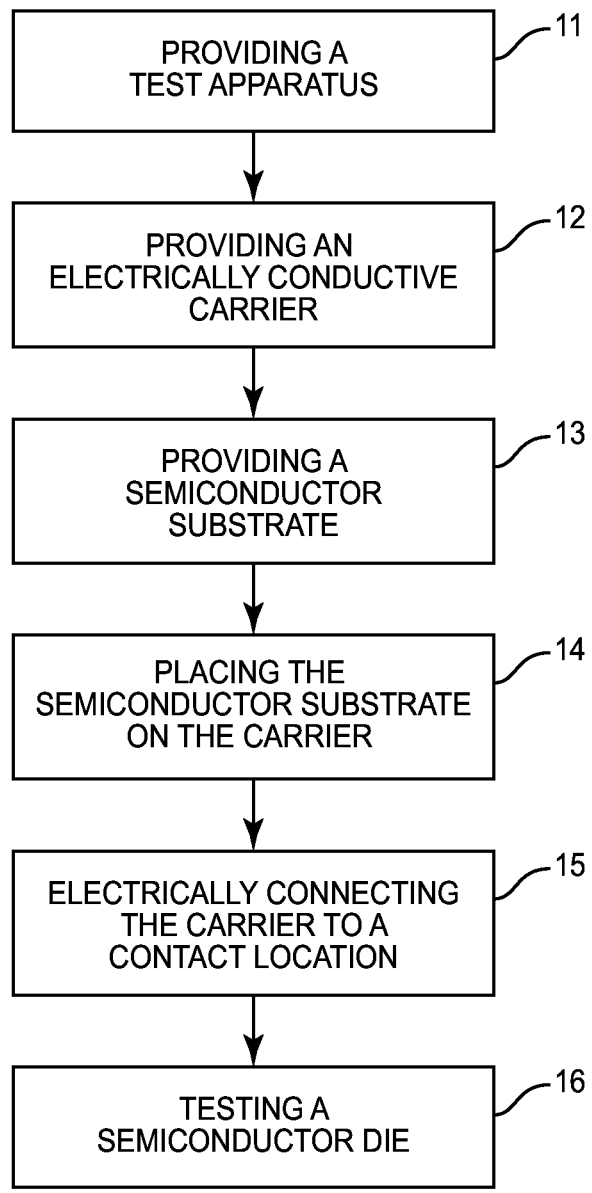
FIG. 1 shows a flow diagram for illustrating a method for testing semiconductor dies according to an example.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

Examples of a method for testing semiconductor dies and an apparatus for testing semiconductor dies may use various types of semiconductor dies, among them MOS transistor structures or vertical transistor structures like, for example, IGBT (insulated gate bipolar transistor) structures or, in general, transistors or other structures or devices in which at least one electrical contact element is arranged on a first main face of the semiconductor die and at least one other electrical contact element is arranged on a second main face of the semiconductor die opposite to the first main face of the semiconductor die.

In the claims and in the following description different examples of a method for testing semiconductor dies are described as a particular sequence of processes or measures, in particular in the flow diagram. It is to be noted that the examples should not be limited to the particular sequence described. Particular ones or all of different processes or measures can also be conducted simultaneously or in any other useful and appropriate sequence.

FIG. 1 shows a flow diagram for illustrating a method 10 for testing semiconductor dies according to an example. The method 10 comprises providing a test apparatus (box 11), providing an electrically conductive carrier (box 12), providing a semiconductor substrate comprising a first main face and a second main face opposite to the first main face and a plurality of semiconductor dies, the semiconductor dies comprising a first contact element on the first main face and a second contact element on the second main face, respectively (box 13), placing the semiconductor substrate on the carrier with the second main face facing the carrier (box 14), electrically connecting the carrier to a contact location disposed on the first main face (box 15), and testing a semiconductor die by electrically connecting the test apparatus with the first contact element of the semiconductor die and the contact location (box 16).

The above method 10 allows to test semiconductor dies having vertical structures and being integrated on one and the same semiconductor substrate by means of a lateral test pin arrangement wherein test pins are connected with one and the same main face of the semiconductor substrate. In a test configuration wherein a test apparatus is connected with an upper, first main face of the semiconductor substrate, the above method 10 avoids connecting the test apparatus by an electrical wire to the lower, second main face of the semiconductor substrate. The length of such an electrical wire would imply a high parasitic inductance. The above method 10 thus allows to make test measurements at vertically structured semiconductor dies in the same way as with laterally structured semiconductor dies.

According to an example of the method 10 of FIG. 1, a part of or all of the semiconductor dies comprise one or more of a transistor, a power transistor, a vertical transistor an MOS transistor, and an insulated gate bipolar (IGB) transistor.

According to an example of the method 10 of FIG. 1, electrically connecting the carrier to the contact location comprises temporarily connecting the carrier to the contact location, in particular, connecting the carrier to the contact location only in a time interval in which testing of a semiconductor die is performed, i.e. electrical test signals are applied to the semiconductor die. According to an example thereof, the semiconductor substrate may comprise an auxiliary semiconductor die which is capable of providing an electrical connection between the carrier and the contact location. According to an example thereof, the auxiliary semiconductor die may comprise an electrical device having a vertical structure which means that for electrically connecting the device the auxiliary semiconductor die may comprise a first contact element on the first main face of the semiconductor substrate and a second contact element on the second main face of the semiconductor substrate. In particular, the first contact element of the auxiliary semiconductor die can be identical with the contact location.

According to an example of the method 10 of FIG. 1, the semiconductor die may comprise one or more of a switch, a transistor, a vertical transistor, an MOS transistor, and an insulated gate bipolar (IGB) transistor.

According to an example of the method 10 of FIG. 1, the auxiliary semiconductor die is of the same type as the semiconductor dies of the plurality of semiconductor dies. In particular, the auxiliary semiconductor die can be one out of the plurality of semiconductor dies. According to an example thereof, the auxiliary semiconductor die can be one particular semiconductor die always being the same one regardless of which semiconductor die is momentarily under test. According to another example, the auxiliary semiconductor die can be a "flying" one which means that the auxiliary semiconductor die is one which is always in the vicinity of or adjacent to the semiconductor die momentarily under test. In particular, the auxiliary semiconductor die can be the one which is nearest to the semiconductor die under test or that one which is immediately side-by-side adjacent to the semiconductor die under test.

According to an example of the method 10 of FIG. 1, testing the semiconductor die comprises generating first control signals and to supply the first control signals to the semiconductor die under test, and generating second control signals and to supply the second control signals to the auxiliary semiconductor die. According to an example thereof, the first and second control signals are synchronized to each other. According to an example thereof, the auxiliary semiconductor die is driven by the second control signals only during test measurement intervals in which the first control signals are supplied to the semiconductor die under test. Driving the auxiliary semiconductor die with the second control signals may imply generating a conductive path between the first contact element and the second contact element of the auxiliary semiconductor die and thus between the electrically conductive carrier and the contact location. More specifically, in case of the auxiliary semiconductor die comprising a transistor, driving the auxiliary semiconductor die may imply switching the transistor ON.

As mentioned above, according to one example, the auxiliary semiconductor die is arranged sidewise of the semiconductor die under test and is only one of the plurality of semiconductor dies which may be comprised of vertical transistor devices. One advantage of this configuration is that the semiconductor die to be tested and the auxiliary semiconductor die have equal current loads when both vertical transistors thereof are switched on. As a consequence there should occur no current limitations during testing the semiconductor die.

Figure 2:
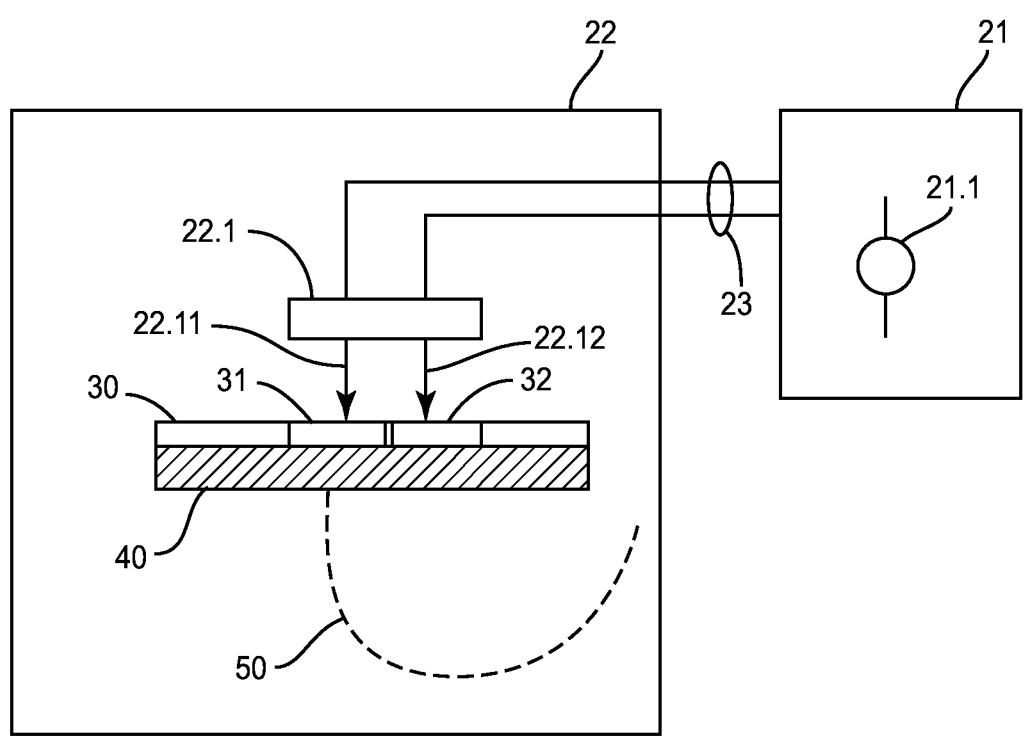
FIG. 2 shows a schematic cross-sectional side view representation of a test environment together with a test apparatus.

FIG. 2, shows a schematic representation of a test apparatus 20 for testing semiconductor dies according to an example. The test apparatus 20 of FIG. 2 comprises a test unit 21 and a probe unit 22. The test unit 21 is connected with the probe unit 22 by means of connection lines 23. The probe unit 22 may comprise a test pin assembly 22.1 comprising first test pins 22.11 and second test pins 22.12, wherein the first test pins 22.11 are arranged to be connected with contact elements of a semiconductor die 31 to be tested and the second test pins 22.12 are arranged to be connected with contact elements of an auxiliary semiconductor die 32. The control unit 21 is configured to generate first control signals and to supply the first control signals to the first test pins 22.11 and to generate second control signals and to supply the second control signals to the second test pins 22.12. The semiconductor dies 31 and 32 are integrated on a semiconductor substrate, which can be a semiconductor wafer after frontend processing.

The control unit 21 may comprise a voltage or current source 21.1 and a circuitry programmed to generate first and second control signals according to different test procedures.

According to an example of the test apparatus 20 of FIG. 2, the control unit 21 is configured to generate first and second control signals which are synchronized to each other.

According to an example of the test apparatus 20 of FIG. 2, the test pin assembly 22.1 is configured in the form of a probe card.

According to an example of the test apparatus 20 of FIG. 2, the first and second test pins 22.11 and 22.12 are disposed relative to each other so that they are to be connected to a semiconductor die 31 and an auxiliary semiconductor die 32 which are arranged in a sidewise manner and are fabricated on one and the same semiconductor substrate 30 which can, for example, be comprised of a semiconductor wafer, in particular a silicon wafer. In particular, the semiconductor devices to be tested may comprise transistors, in particular vertical transistors, in particular insulated gate bipolar (IGB) transistors. In this case, the semiconductor dies having the semiconductor devices fabricated thereon, comprise first contact elements, namely a source contact element and a gate contact element on the first upper main face of the semiconductor substrate 30 and a second contact element in the form of a drain contact element on the second, lower main face of the semiconductor substrate 30. In this case and in an exemplary simple configuration, the first test pins 22.11 may comprise two test pins for making contact to the source contact element and the gate contact element of the semiconductor die 31 under test and in the same way the second test pins 22.12 may be comprised of two test pins for making contact to the source contact element and the gate contact element of the auxiliary semiconductor die 32.

According to an example of the test apparatus 20 of FIG. 2, the test apparatus 20 further comprises a carrier 40 for receiving a semiconductor substrate having a plurality of semiconductor dies 31 fabricated thereon. According to an example thereof, the carrier 40 is configured to receive a semiconductor substrate in the form of a semiconductor wafer, in particular one having a standard size. According to an example, the carrier 40 comprises an electrically conductive material and, more specifically, the carrier 40 comprises a chuck. The chuck can be of any form and structure and it can comprise means for sucking the semiconductor substrate.

FIG. 2 also depicts a dashed line 50 connected with the carrier 40. The dashed line 50 designates a connection line 50 which would be necessary to connect the carrier 40 and the second contact elements of the semiconductor dies 31 to the test unit 21 if an auxiliary semiconductor die 32 was not used. Such a connection line 50 would be disadvantageous because of high parasitic inductance.

Figure 3:
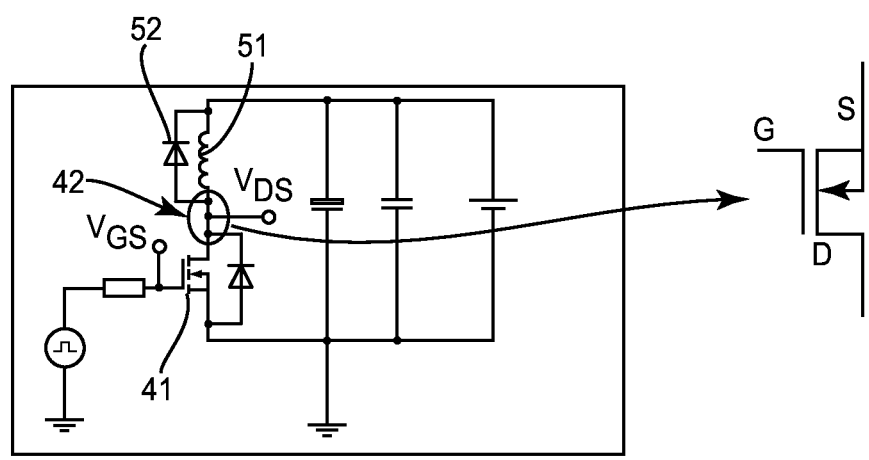
FIG. 3 shows an equivalent circuit diagram of a test circuit for testing a semiconductor power transistor.

FIG. 3 shows a schematic circuit diagram which represents an equivalent circuit of a switching times test circuit 30 for inductive load for testing MOS transistor devices. The test circuit 30 shown in FIG. 3 shows a MOS transistor 41 the gate of which is connected to a voltage source $V_{GS}$. The drain contact of the MOS transistor 41 is connected to the drain contact of an auxiliary semiconductor device 42 which is also comprised of a MOS transistor. Both drain contacts are interconnected by the electrically conductive carrier as shown in FIG. 2. The source contact of the auxiliary semiconductor device 42 is connected to the test unit by means of an inductor 51 and a diode 52 connected in parallel to the inductor 51. The gate contact of the auxiliary semiconductor device 42 is also connected to the test unit. The test unit generates and delivers driver signals to the gate contacts of the semiconductor die 41 under test and the auxiliary semiconductor device 42. During test intervals of the semiconductor die under test 41 the auxiliary semiconductor device 42 should be switched on by supplying electrical signals to the gate contact element. As a result, a current flowing through the semiconductor die 41 under test flows via the carrier to the drain contact element of the auxiliary semiconductor device 42 and via the conductive path of the transistor device to the source element of the auxiliary semiconductor device 42. The source element of the auxiliary semiconductor device is located at the upper main face of the semiconductor substrate and forms a contact location which can be connected by test pins of the test pin assembly, in particular the probe card. In this way, a variety of different test schemes and procedures can be performed.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A test apparatus for testing semiconductor dies, comprising:

an electrically conductive carrier for receiving a semiconductor wafer, the semiconductor wafer having a plurality of semiconductor dies fabricated on the semiconductor wafer, each one of the semiconductor dies comprising a vertical transistor having a first contact element on a first upper main face of the semiconductor wafer and a second contact element on a second lower main face of the semiconductor wafer, wherein the second lower main face of the semiconductor wafer is to be connected with the electrically conductive carrier so that each one of the second contact elements of the semiconductor dies is electrically connected with the electrically conductive carrier;

a test pin assembly comprising first test pins and second test pins, wherein the first test pins are arranged to be connected with contact elements of a semiconductor die to be tested, and the second test pins are arranged to be connected with contact elements of an auxiliary semiconductor die; and a control device connected with the test pin assembly and configured to generate first control signals and supply the first control signals to the first test pins, and to generate second control signals and supply the second control signals to the second test pins, wherein the first control signals are configured as electrical test signals for testing a first semiconductor die of the plurality of semiconductor dies, and the second control signals are configured to drive a second, auxiliary semiconductor die of the plurality of semiconductor dies during test measurement intervals in which the first control signals are supplied to the first semiconductor die, wherein the second control signals are further configured to establish an electrical connection between first and second electrical contact elements of the second, auxiliary semiconductor die during the test measurement intervals.

2. The test apparatus according to claim 1, wherein the first and second test pins are disposed relative to each other so that the first and second test pins are to be connected to the first semiconductor die and the second, auxiliary semiconductor die in the vicinity of or adjacent to the semiconductor dies, respectively.

3. The test apparatus according to claim 1, wherein the test pin assembly is a probe card.

4. The test apparatus according to claim 1, wherein the vertical transistor of each one of the semiconductor dies is comprised of an integrated gate bipolar transistor comprising on a first upper main face thereof a source contact element and a gate contact element, and comprising on a second lower main face thereof a drain contact element, and wherein the first test pins comprise two first test pins for making contact to the source contact element and the gate contact element of the first semiconductor die, and the second test pins comprise two second test pins for making contact to the source contact element and the gate contact element of the second, auxiliary semiconductor die.

* * * * *